(12) United States Patent
Mino

(10) Patent No.: US 10,999,927 B2
(45) Date of Patent: May 4, 2021

(54) CERAMIC SUBSTRATE AND METHOD FOR MANUFACTURING CERAMIC SUBSTRATE

(71) Applicant: Murata Manufacturing Co., Ltd., Kyoto (JP)

(72) Inventor: Yosuke Mino, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/394,459

(22) Filed: Apr. 25, 2019

(65) Prior Publication Data

US 2019/0254162 A1 Aug. 15, 2019

Related U.S. Application Data

(63) Continuation of application No. PCT/JP2017/038264, filed on Oct. 24, 2017.

(30) Foreign Application Priority Data

Nov. 11, 2016 (JP) .............................. JP2016-220913

(51) Int. Cl.
*H05K 1/03* (2006.01)
*H05K 1/11* (2006.01)
*H05K 3/12* (2006.01)
*H05K 3/34* (2006.01)
(Continued)

(52) U.S. Cl.
CPC .......... *H05K 1/0306* (2013.01); *H05K 1/111* (2013.01); *H05K 3/1291* (2013.01); *H05K 3/28* (2013.01); *H05K 3/34* (2013.01); *H05K 1/181* (2013.01)

(58) Field of Classification Search
CPC .......... H05K 1/0306; H05K 3/28; H05K 3/34; H05K 3/1291; H05K 3/3452; H05K 2203/0537; H05K 3/4629; H05K 2201/09036
See application file for complete search history.

(56) References Cited

U.S. PATENT DOCUMENTS

| | | | | |
|---|---|---|---|---|
| 3,560,256 | A * | 2/1971 | Abrams ................. | H01C 13/02 174/261 |
| 5,864,263 | A * | 1/1999 | Takimoto .............. | H01P 11/007 333/202 |
| 9,343,229 | B2 * | 5/2016 | Kim ........................ | H01G 4/30 |

(Continued)

FOREIGN PATENT DOCUMENTS

| | | |
|---|---|---|
| JP | H02-122594 A | 5/1990 |
| JP | H03-219605 A | 9/1991 |

(Continued)

OTHER PUBLICATIONS

International Search Report for International Application No. PCT/JP2017/038264 dated Jan. 30, 2018.

(Continued)

*Primary Examiner* — Ishwarbhai B Patel
(74) *Attorney, Agent, or Firm* — Pearne & Gordon LLP

(57) ABSTRACT

A ceramic substrate according to the present disclosure includes a plurality of electrodes on an electronic component mounting surface, and one or more interelectrode wires that connect the electrodes to each other on the electronic component mounting surface. A resist that extends across the interelectrode wire is disposed on the electronic component mounting surface.

4 Claims, 8 Drawing Sheets

(51) Int. Cl.
  *H05K 3/28*      (2006.01)
  *H05K 1/18*      (2006.01)

(56)          References Cited

U.S. PATENT DOCUMENTS

2003/0011999 A1    1/2003  Urakawa et al.
2004/0227258 A1*  11/2004  Nakatani ............. H01L 23/5385
                                                257/787
2017/0245374 A1*   8/2017  Williams-Duncan .......................
                                                H05K 3/282

FOREIGN PATENT DOCUMENTS

JP      H04-037091 A      2/1992
JP      H05-275836 A     10/1993
JP      H07-142849 A      6/1995
JP      H07-192954 A      7/1995
JP      H09-223870 A      8/1997
JP      2001-320168 A    11/2001
JP      2003-174261 A     6/2003
JP      2005-197422 A     7/2005

OTHER PUBLICATIONS

Written Opinion for International Application No. PCT/JP2017/038264 dated Jan. 30, 2018.
Notice of Reasons for Rejection for Japanese Patent Application No. 2018-550115, dispatch date Apr. 7, 2020.

* cited by examiner

CERAMIC SUBSTRATE AND METHOD FOR MANUFACTURING CERAMIC SUBSTRATE

This is a continuation of International Application No. PCT/JP2017/038264 filed on Oct. 24, 2017 which claims priority from Japanese Patent Application No. 2016-220913 filed on Nov. 11, 2016. The contents of these applications are incorporated herein by reference in their entireties

BACKGROUND OF THE DISCLOSURE

Field of the Disclosure

The present disclosure relates to a ceramic substrate and a method for manufacturing the ceramic substrate.

Description of the Related Art

A ceramic substrate has a first surface that is to be connected to a motherboard and a second surface on which electronic components are mounted.

Patent Document 1 discloses a method of coating electrodes on an upper surface of a ceramic multilayer substrate with covers in order to increase the strength of close contact between the substrate and pads (electrodes). Specifically, Patent Document 1 discloses a method of applying a cover coating paste to a film sheet that is easy to be released, and bonding and pressing the film sheet and a ceramic green sheet to which an electrode paste is applied.

Patent Document 1: Japanese Unexamined Patent Application Publication No. 9-223870

BRIEF SUMMARY OF THE DISCLOSURE

In some cases where a plurality of electronic components are mounted on a ceramic substrate, electrodes for mounting the electronic components are electrically connected to each other by using wires (interelectrode wires) that are formed on an electronic component mounting surface. Regarding the method disclosed in Patent Document 1, although the electrodes are coated with the covers, it is not considered that the interelectrode wires are coated with covers. In the case where the electrodes are coated with the covers, and the interelectrode wires are not coated with covers, there is a problem in that solder spreads out between the electrodes when the components are mounted.

A conceivable method for disposing the electrodes and the interelectrode wires on the electronic component mounting surface and coating an appropriate portion with a cover is to apply a conductive paste to the electronic component mounting surface, dispose the electrodes and the interelectrode wires, and apply a resist pattern that is used as the cover coating. This method, however, has a problem in that the resist pattern that is applied spreads because there are steps formed by the electrodes and the interelectrode wires when the resist pattern is applied.

The present disclosure has been accomplished to solve the above problem, and it is an object of the present disclosure to provide a ceramic substrate that can prevent the solder from spreading out between the electrodes when a component is mounted, and a method for manufacturing the ceramic substrate that includes a resist, which is used as a cover coating, is formed on an interelectrode wire while a resist pattern is prevented from spreading.

A ceramic substrate according to the present disclosure includes a plurality of electrodes on an electronic component mounting surface, and one or more interelectrode wires that connect the electrodes to each other on the electronic component mounting surface. A resist that extends across the interelectrode wire is disposed on the electronic component mounting surface. Since the resist that extends across the interelectrode wire is disposed on the electronic component mounting surface, solder can be prevented from spreading out between the electrodes when a component is mounted.

In the ceramic substrate according to the present disclosure, an upper surface of the resist that extends across the interelectrode wire is preferably flat. In the case where the upper surface of the resist is flat, the work efficiency when an electronic component is mounted increases.

In the ceramic substrate according to the present disclosure, each of the electrodes and the interelectrode wires preferably includes a front surface, a back surface, a front surface corner portion that extends from the front surface toward the back surface and that has a round chamfer shape, and a back surface corner portion that extends from the back surface toward the front surface and that has a round chamfer shape, and a radius of curvature of the back surface corner portion is preferably larger than a radius of curvature of the front surface corner portion. In the case where the interelectrode wire has such a shape, electric-field concentration on an end portion of the interelectrode wire can be mitigated, and better transmission characteristics can be achieved.

A ceramic substrate according to another aspect of the present disclosure includes an electrode on an electronic component mounting surface, in which a resist that divides the electrode into a plurality of of electrode pieces by extending across the electrode is disposed on the electronic component mounting surface. This aspect enables the resist that extends across the electrode to divide the electrode into a plurality of electrode pieces for use even when no interelectrode wire is disposed on the electronic component mounting surface. An electronic device that includes electronic components that are mounted on the corresponding pieces can be obtained. This aspect also can prevent the solder from spreading between the electrode pieces when the components are mounted.

A method according to the present disclosure for manufacturing a ceramic substrate includes a step of preparing a ceramic green sheet that includes a plurality of electrodes on an electronic component mounting surface and one or more interelectrode wires that connect the electrodes to each other on the electronic component mounting surface, a step of preparing a resist sheet that has a resist pattern on an upper surface, and a step of disposing and pressure-bonding the resist sheet such that the resist pattern overlaps with the electronic component mounting surface of the ceramic green sheet, and transferring a resist such that the resist of the resist sheet extends across the interelectrode wire.

In the above manufacturing method, the resist that extends across the interelectrode wire is formed by transferring the resist from the resist sheet that has the resist pattern. The method prevents the resist from spreading. The interelectrode wire is pushed into the ceramic green sheet by pressure bonding during transferring. Accordingly, it prevents the height of a portion of the resist that extends across the interelectrode wire from being more than that in the vicinity thereof after the resist is transferred, and the coplanarity of the vicinity of the interelectrode wire can be increased.

In the method according to the present disclosure for manufacturing the ceramic substrate, the resist sheet is preferably prepared in a manner in which the resist pattern is applied, i.e., printed to a release film, the release film is pressure-bonded to a transfer sheet, and the release film is separated to transfer the resist pattern to the transfer sheet, the resist sheet that is formed of the transfer sheet to which the resist pattern is transferred is preferably disposed and pressure-bonded such that the resist pattern overlaps with the electronic component mounting surface of the ceramic green sheet, and the transfer sheet is preferably separated to transfer the resist such that the resist on the transfer sheet extends across the interelectrode wire.

In the method according to the present disclosure for manufacturing the ceramic substrate, the resist sheet is preferably prepared in a manner in which the resist pattern is applied to a firing sheet that is made of a material that is burnt out at a firing temperature of the ceramic green sheet, the resist sheet that is formed of the firing sheet to which the resist pattern is applied is preferably disposed and pressure-bonded such that the resist pattern overlaps with the electronic component mounting surface of the ceramic green sheet, and the firing sheet is preferably burnt out by firing the ceramic green sheet and the resist sheet to transfer the resist such that the resist on the firing sheet extends across the interelectrode wire.

In the method according to the present disclosure for manufacturing the ceramic substrate, the resist sheet is preferably prepared in a manner in which the resist pattern is applied to a separation sheet that is separable after the separation sheet is pressure-bonded to the ceramic green sheet, the resist sheet that is formed of the separation sheet to which the resist pattern is applied is preferably disposed and pressure-bonded such that the resist pattern overlaps with the electronic component mounting surface of the ceramic green sheet, and the separation sheet is preferably separated to transfer the resist such that the resist on the separation sheet extends across the interelectrode wire.

In the method according to the present disclosure for manufacturing the ceramic substrate, the thickness of the interelectrode wire is preferably no less than 5 μm and no more than 30 μm. When the thickness of the interelectrode wire is in this range, the coplanarity is likely to be particularly preferably increased.

A method according to another aspect of the present disclosure for manufacturing a ceramic substrate includes a step of preparing a ceramic green sheet that includes an electrode on an electronic component mounting surface, a step of preparing a resist sheet that has a resist pattern on an upper surface, and a step of disposing and pressure-bonding the resist sheet such that the resist pattern overlaps with the electronic component mounting surface of the ceramic green sheet, and transferring a resist such that the resist of the resist sheet extends across the electrode. This aspect enables the resist to be transferred such that the resist of the resist sheet extends across the electrode. The ceramic substrate that includes the divided electrode pieces can be manufactured. This method also prevents the resist from spreading. The electrode is pushed into the ceramic green sheet by pressure bonding during transferring. Accordingly, it prevents the height of a portion of the resist that extends across the electrode from being more than that in the vicinity after the resist is transferred, and the coplanarity of the vicinity of the resist that extends across the electrode can be increased.

A ceramic substrate according to the present disclosure can prevent the solder from spreading out between the electrodes when a component is mounted. A method according to the present disclosure for manufacturing the ceramic substrate prevents a resist pattern from spreading and enables the manufactured ceramic substrate to include a resist, which is used as a cover coating, on an interelectrode wire.

DETAILED DESCRIPTION OF THE DISCLOSURE

A ceramic substrate according to the present disclosure and a method for manufacturing the ceramic substrate will hereinafter be described. The present disclosure, however, is not limited to the features described below and can be appropriately modified without departing from the spirit of the present disclosure. The present disclosure also includes a combination of two or more desirable features of the present disclosure described below. It goes without saying that the embodiments are described below by way of example and that the features described according to different embodiments can be partially replaced or combined.

A ceramic substrate according to the present disclosure includes a plurality of electrodes and one or more interelectrode wires that are disposed on an electronic component mounting surface. The electrodes and the interelectrode wires that are disposed on the electronic component mounting surface will now be described with reference to a drawing of an electronic device that includes a ceramic substrate according to an embodiment of the present disclosure.

Figure 1:
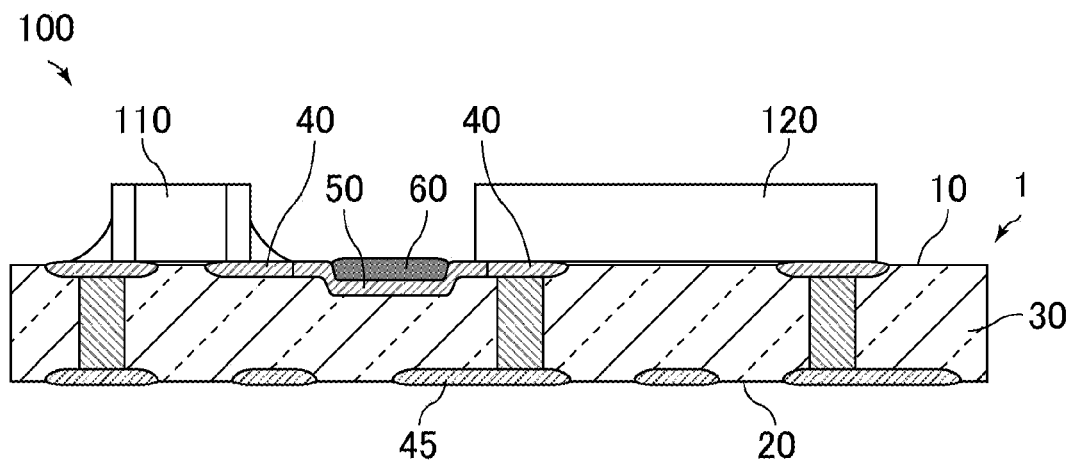
FIG. 1 is a schematic sectional view of an example of an electronic device that includes a ceramic substrate according to an embodiment of the present disclosure.

FIG. 1 is a schematic sectional view of an example of an electronic device that includes a ceramic substrate according to the embodiment of the present disclosure. An electronic device 100 is configured by mounting a plurality of electronic components (for example, a multilayer ceramic capacitor 110 and a semiconductor component 120 that are chip-shaped electronic components) on an electronic component mounting surface 10 that is a main surface of a ceramic substrate 1. The ceramic substrate 1 illustrated in FIG. 1 is a single-layer substrate that has a single ceramic layer 30 but may be a multilayer substrate that has ceramic layers that are stacked. A motherboard electrode 45 is disposed on a motherboard mounting surface 20 that is the other main surface of the ceramic substrate 1. The motherboard electrode 45 is used as a measure for electric connection when the electronic device 100 is mounted on a motherboard not illustrated.

Electrodes 40 for mounting the corresponding electronic components thereon are disposed on the electronic component mounting surface of the ceramic substrate 1. The term simply referred to as an "electrode" in the specification means the electrode that is disposed on the electronic component mounting surface and that is used to mount the electronic component on the ceramic substrate and does not mean a motherboard electrode that is used as the measure for electric connection to mount the electronic device on the motherboard.

Interelectrode wires 50 are disposed between the electrodes 40. The electrodes 40 are electrically connected to each other by using the interelectrode wires 50. The interelectrode wires 50 are disposed on the electronic component mounting surface 10. Resists 60 extend across the interelectrode wires. The positional relationship among the electrodes 40, the interelectrode wires 50, and the resists 60 of the ceramic substrate 1 will be described with reference to FIG. 2.

Figure 2:
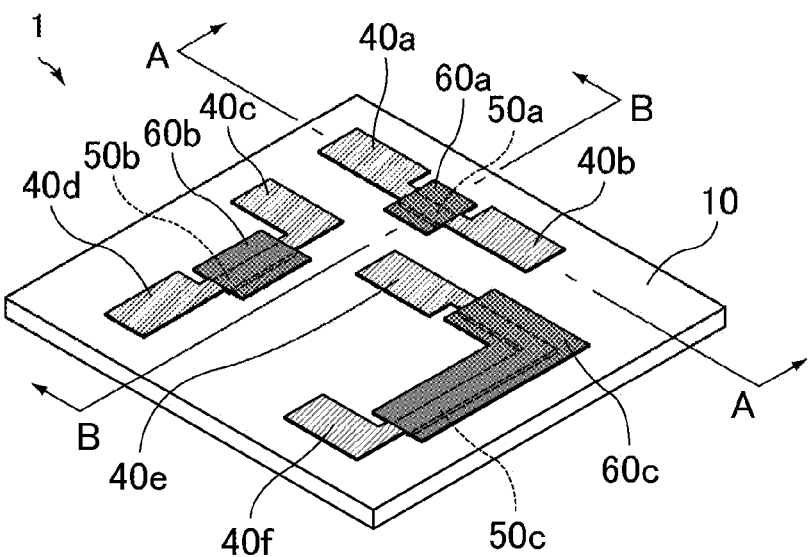
FIG. 2 is a schematic perspective view of an example of an electronic component mounting surface of the ceramic substrate according to the embodiment of the present disclosure.

FIG. 2 is a schematic perspective view of an example of the electronic component mounting surface of the ceramic substrate according to the embodiment of the present disclosure. On the electronic component mounting surface 10 of the ceramic substrate 1 illustrated in FIG. 2, six electrodes (an electrode 40a, an electrode 40b, an electrode 40c, an electrode 40d, an electrode 40e, and an electrode 40f) for mounting the electronic components are illustrated, and three interelectrode wires (an interelectrode wire 50a, an interelectrode wire 50b, and an interelectrode wire 50c) that electrically connect the corresponding electrodes to each other are disposed. In addition, three resists (a resist 60a, a resist 60b, and a resist 60c) that extend across the interelectrode wires are disposed. The sentence "resists extend across the interelectrode wires" means that the width of each of the resists is wider than the linewidth of the corresponding interelectrode wire and the upper surfaces of the interelectrode wires are covered by the resists. As illustrated in FIG. 2, the resists do not necessarily extend across the interelectrode wires over the entire length, and the resists may not extend across the portions of the interelectrode wires near the electrodes.

Figure 3:
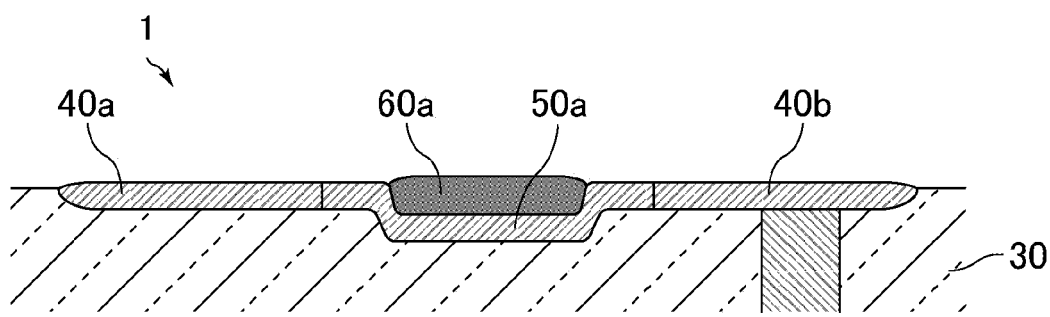
FIG. 3 is an enlarged schematic sectional view of a portion of a resist that extends across an interelectrode wire and corresponds to a sectional view of FIG. 2 taken along line A-A.

In the ceramic substrate according to the present disclosure, the height of each resist that extends across the corresponding interelectrode wire is preferably not more than that of the vicinity thereof, and the coplanarity of the vicinity of the interelectrode wire is preferably high (flat). This will be described with reference to FIG. 3. FIG. 3 is an enlarged schematic sectional view of a portion of one of the resists that extend across the interelectrode wires and corresponds to a sectional view of FIG. 2 taken along line A-A.

As illustrated in FIG. 3, in the ceramic substrate 1, a portion of the interelectrode wire 50a on which the resist 60a is disposed is embedded in the ceramic layer 30. Consequently, the upper surface of the resist 60a, the upper surface of a portion of the interelectrode wire 50a that is not covered by the resist 60a, the upper surface of the electrode 40a, and the upper surface of the electrode 40b are flush with each other. That is, the coplanarity of the vicinity of the interelectrode wires is high. Since the coplanarity of this portion is high, work efficiency when the electronic components are mounted increases.

Figure 4A:
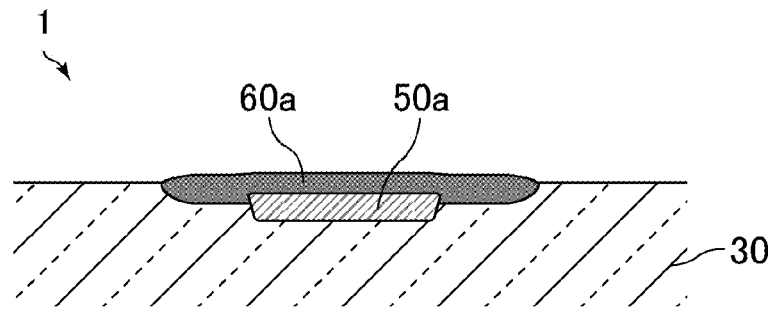
FIG. 4A is an enlarged schematic sectional view of a portion of the resist that extends across the interelectrode wire and corresponds to a sectional view of FIG. 2 taken along line B-B.

FIG. 4A is an enlarged schematic sectional view of a portion of the resist that extends across the interelectrode wire and corresponds to a sectional view of FIG. 2 taken along line B-B. FIG. 4A illustrates the linewidth of the resist 60a that is wider than the linewidth of the interelectrode wire 50a, and the upper surface of the interelectrode wire 50a that is covered by the resist 60a. The upper surface of the resist 60a is flat. The fact that the upper surface of the resist is flat means that there is substantially no step between a portion of the resist under which there is the interelectrode wire and the other portion under which there is no interelectrode wire. As illustrated in FIG. 4A, since the interelectrode wire 50a is embedded in the ceramic layer 30, the upper surface of the resist 60a is flat.

Figure 4B:
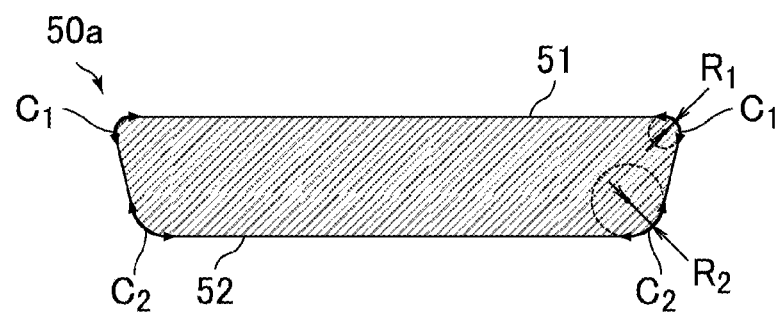
FIG. 4B and FIG. 4C illustrate schematic sectional views of examples of a sectional shape of the interelectrode wire.
Figure 4C:
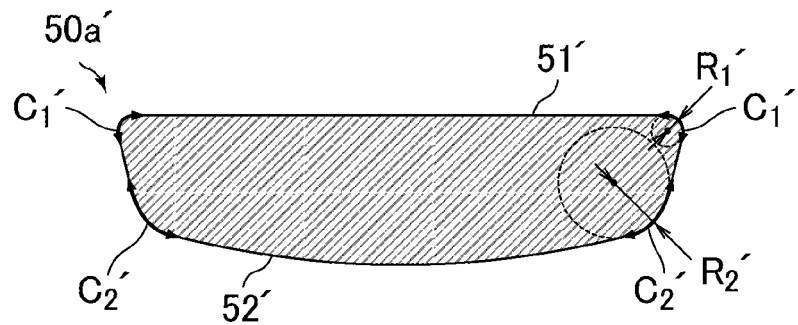

Each interelectrode wire preferably includes a front surface, a back surface, a front surface corner portion that extends from the front surface toward the back surface and that has a round chamfer shape, and a back surface corner portion that extends from the back surface toward the front surface and that has a round chamfer shape. The radius of curvature of the back surface corner portion is preferably larger than the radius of curvature of the front surface corner portion. FIG. 4B and FIG. 4C illustrate schematic sectional views of examples of the sectional shape of the interelectrode wire. FIG. 4B illustrates an example of the sectional shape that has a flat portion with a constant conductor thickness. In FIG. 4B, the interelectrode wire 50a has a front surface 51 and a back surface 52 opposite the front surface 51, and has the flat portion with the constant conductor thickness, front surface corner portions (illustrated by double-headed arrows $C_1$) that extend from the front surface 51 toward the back surface 52, and back surface corner portions (illustrated by double-headed arrows $C_2$) that extend from the back surface 52 toward the front surface 51. FIG. 4B illustrates the radius of curvature of the front surface corner portions $C_1$ by $R_1$, and the radius of curvature of the back surface corner portions $C_2$ by $R_2$, and $R_2 > R_1$ holds. Although there are two front surface corner portions $C_1$, the radii of curvature $R_1$ of the two front surface corner portions $C_1$ may be the same or may differ from each other. Although there are two back surface corner portions $C_2$, the radii of curvature $R_2$ of the two back surface corner portions $C_2$ may be the same or may differ from each other. The overall shape of the interelectrode wire 50a illustrated in FIG. 4B is a substantially trapezoidal shape. The sectional shape of the interelectrode wire of the ceramic substrate of the present disclosure is preferably a substantially trapezoidal shape. FIG. 4C illustrates an example of the sectional shape in which the back surface is convex and the conductor thickness of a central portion of the wire increases. In FIG. 4C, the interelectrode wire 50a' has a front surface 51' and a back surface 52' opposite to the front surface 51' and has front surface corner portions (illustrated by double-headed arrows $C_1'$) that extend from the front surface 51' toward the back surface 52' and back surface corner portions (illustrated by double-headed arrows $C_2'$) that extend from the back surface 52' toward the front surface 51'. FIG. 4C illustrates the radius of curvature of the front surface corner portions $C_1'$ by $R_1'$, and the radius of curvature of the back surface corner portions $C_2'$ by $R_2'$, and $R_2'>R_1'$ holds. Although there are two front surface corner portions $C_1'$, the radii of curvature $R_1'$ of the two front surface corner portions $C_1'$ may be the same or may differ from each other. Although there are two back surface corner portions $C_2'$, the radii of curvature $R_2'$ of the two back surface corner portions $C_2'$ may be the same or may differ from each other. The front surface 51' of the interelectrode wire 50a' illustrated in FIG. 4C is flat, and the back surface 52' is convex downward. Accordingly, the overall shape is a substantially trapezoidal shape the bottom surface of which bends. The sectional shape of the interelectrode wire of the ceramic substrate of the present disclosure is also preferably a substantially trapezoidal shape the bottom surface of which bends.

As with the sectional shape of each interelectrode wire, the sectional shape of each electrode is preferably formed by a front surface, a back surface, a front surface corner portion that extends from the front surface toward the back surface and that has a round chamfer shape, and a back surface corner portion that extends from the back surface toward the front surface and that has a round chamfer shape. The radius of curvature of the back surface corner portion is preferably larger than the radius of curvature of the front surface corner portion (that is, a substantially trapezoidal shape, or a substantially trapezoidal shape the bottom surface of which bends).

The components of the ceramic substrate according to the present disclosure will now be described. A ceramic layer that serves as an insulating layer is used for the ceramic substrate. The material of the ceramic layer is not particularly limited but is preferably a low-temperature-sintered ceramic material. Examples of the low-temperature-sintered ceramic material include a glass composite low-temperature-sintered ceramic material such as a mixture of borosilicate glass and a ceramic material such as quartz, alumina, or forsterite, a crystallized-glass-based low-temperature-sintered ceramic material that uses $ZnO$—$MgO$—$Al_2O_3$—$SiO_2$ crystallized glass, and a non-glass-based low-temperature-sintered ceramic material that uses, for example, a $BaO$—$Al_2O_3$—$SiO_2$ ceramic material or an $Al_2O_3$—$CaO$—$SiO_2$—$MgO$—$B_2O_3$ ceramic material.

The material of each electrode and the material of each the interelectrode wire are preferably a conductive material used for a ceramic electronic component that uses a low-temperature-sintered ceramic material. The conductive material preferably contains a metal material. A ceramic material or a glass material may be added. The metal material preferably contains Au, Ag, or Cu, and more preferably contains Ag or Cu. Examples of the ceramic material include alumina, titania, and silica. Examples of the glass material include quartz glass and borosilicate glass. The material of each electrode and the material of each interelectrode wire may be the same or may differ from each other.

The thickness of each interelectrode wire is preferably no less than 5 µm and no more than 30 µm. When the thickness of the interelectrode wire is in this range, the coplanarity is likely to be particularly preferably increased.

The material of each resist is preferably a low-temperature-sintered ceramic material as with the material of the ceramic layer. The low-temperature-sintered ceramic material of the ceramic layer and the low-temperature-sintered ceramic material of the resist may be the same or may differ from each other. The materials are preferably the same in the perspective of the degree of close contact between the resist and the electronic component mounting surface and the matching between the thermal expansion coefficients. Resist patterns each of which contains a low-temperature-sintered ceramic material are transferred so as to extend across the interelectrode wires and are subsequently fired, and consequently, sintered resists are formed so as to extend across the interelectrode wires, which will be described later.

The thickness of each resist is preferably no less than 5 µm and no more than 30 µm. When the thickness of the resist is in this range, the coplanarity is likely to be particularly preferably increased. In particular, the thickness of each resist is preferably close to the thickness of the corresponding interelectrode wire, and the difference between the thickness of the resist and the thickness of the interelectrode wire is preferably 25 µm or less.

Each electronic component that is mounted on the electronic component mounting surface of the ceramic substrate according to the present disclosure can be, but not particularly limited to, for example, a ceramic electronic component such as a multilayer ceramic capacitor, a multilayer inductor, or a multilayer ceramic filter obtained by integrally firing these. The electronic component can be a semiconductor component such as an IC or a memory.

A method according to the present disclosure for manufacturing the ceramic substrate will now be described. The method according to the present disclosure for manufacturing the ceramic substrate includes a step of preparing a ceramic green sheet including, on the electronic component mounting surface, a plurality of electrodes and one or more interelectrode wires that connect the electrodes to each other, a step of preparing a resist sheet that has a resist pattern on an upper surface, and a step of pressure-bonding and disposing the resist sheet such that the resist pattern overlaps with the electronic component mounting surface of the ceramic green sheet, and transferring a resist such that the resist of the resist sheet extends across the interelectrode wire. The step of preparing the resist sheet and the step of transferring the resist such that the resist of the resist sheet extends across the interelectrode wire have several aspects, which will be described below.

Figure 5A:
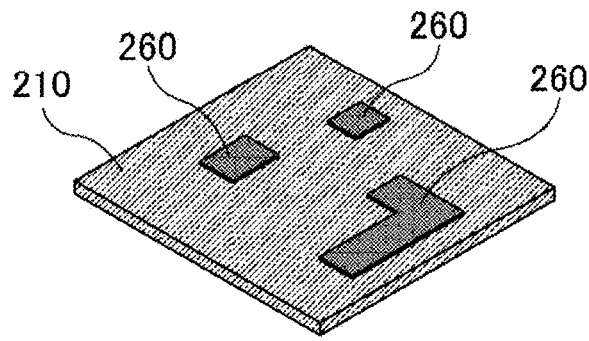
FIG. 5A, FIG. 5B, FIG. 5C, and FIG. 5D schematically illustrate the process diagrams of a part of a first aspect of a method for manufacturing the ceramic substrate.

According to a first aspect of the method for manufacturing the ceramic substrate, the resist sheet is prepared in a manner in which the resist pattern is applied to a release film, the release film is pressure-bonded to a transfer sheet, and the release film is separated to transfer the resist pattern to the transfer sheet, the resist sheet that is formed of the transfer sheet to which the resist pattern is transferred is disposed and pressure-bonded such that the resist pattern overlaps with the electronic component mounting surface of the ceramic green sheet, and the transfer sheet is separated to transfer the resist such that the resist on the transfer sheet extends across the interelectrode wire. FIG. 5A, FIG. 5B, FIG. 5C, and FIG. 5D schematically illustrate the process diagrams of a part of the first aspect of the method for manufacturing the ceramic substrate. As illustrated in FIG. 5A, resist patterns 260 are first applied to a release film 210. The release film includes a release layer formed on a base film such as a PET film and can be a typical release film. The resist patterns can be applied by a printing method that uses a resist paste such as screen printing, photolithography, or ink-jet printing. The resist paste can be a paste that contains the low-temperature-sintered ceramic material described as the material of each resist in the description of the ceramic substrate according to the present disclosure.

Figure 5B:
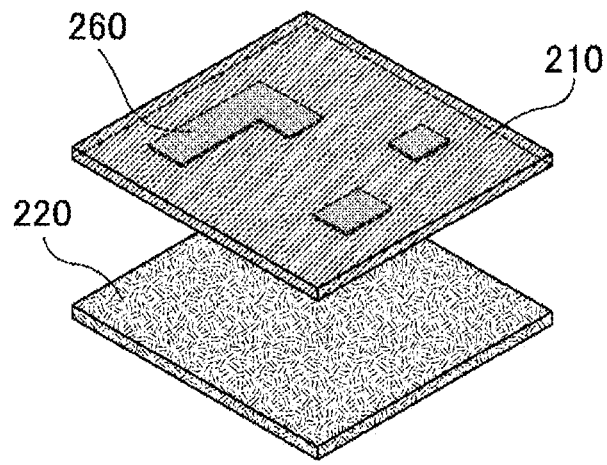
Figure 5C:
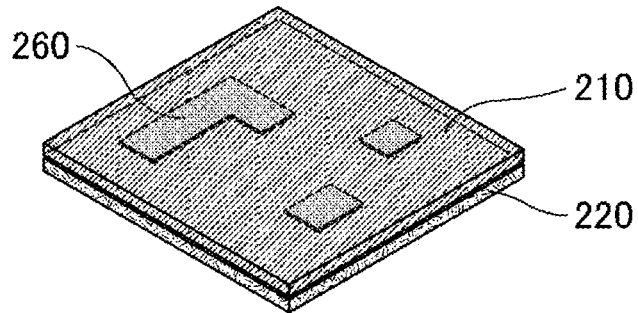
Figure 5D:
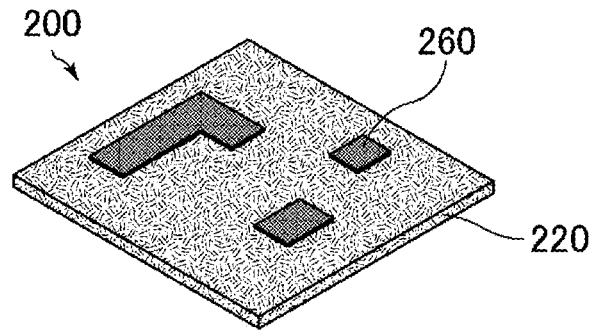

Subsequently, as illustrated in FIG. 5B, the release film 210 is reversed such that the resist patterns 260 face to a transfer sheet 220 to stack the release film 210 and the transfer sheet 220 as illustrated in FIG. 5C. In FIG. 5B, FIG. 5C, and the other figures of the specification in which two or more sheets or films are stacked, the upper sheet or film is illustrated to be transparent in order to schematically illustrate the positional relationship among the resist patterns, the electrodes, and the interelectrode wires. The release film 210 and the transfer sheet 220 that are stacked are pressure-bonded to each other. As illustrated in FIG. 5D, the release film 210 is separated to transfer the resist patterns 260 to the transfer sheet 220. The transfer sheet can be a resin sheet such as a PET resin sheet, a foam separation sheet, or an UV separation sheet. In this way, a resist sheet 200 that has the resist patterns 260 on the upper surface of the transfer sheet 220 is prepared. The thickness of the transfer sheet is preferably 10 μm or more and is preferably 500 μm or less. The pressure, temperature, time of pressure bonding can be freely set.

Figure 6A:
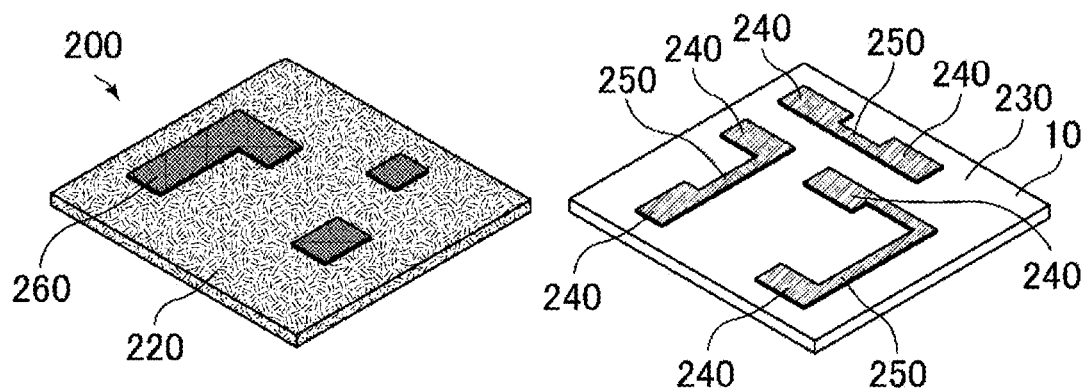
FIG. 6A, FIG. 6B, and FIG. 6C schematically illustrate the process diagrams of a part of the first aspect of the method for manufacturing the ceramic substrate.
Figure 6B:
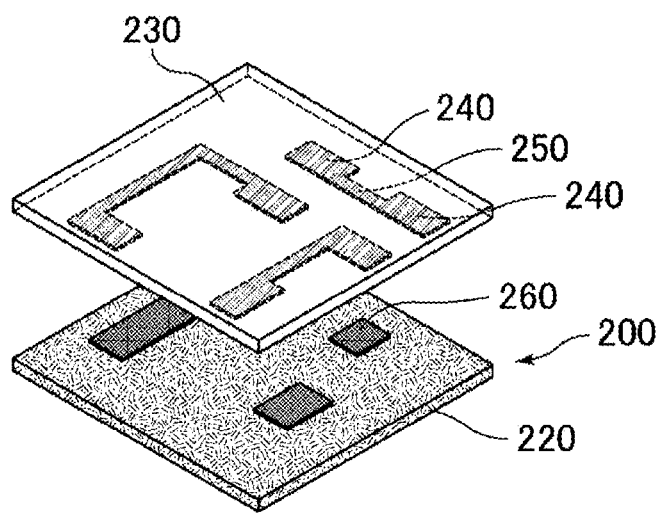
Figure 6C:
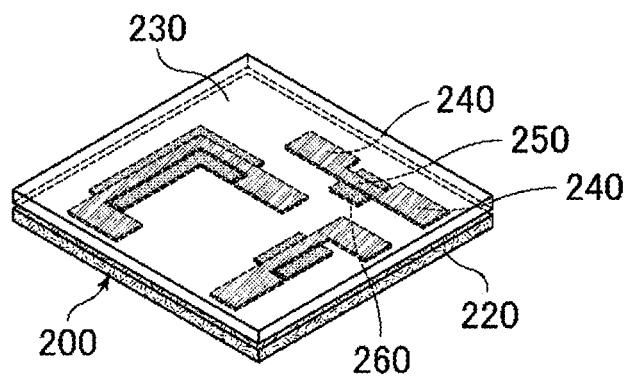

FIG. 6A, FIG. 6B, and FIG. 6C schematically illustrate the process diagrams of a part of the first aspect of the method for manufacturing the ceramic substrate. A ceramic green sheet that includes, on the electronic component mounting surface, a plurality of electrodes and the interelectrode wires that connect the electrodes to each other is separately prepared. FIG. 6A illustrates a ceramic green sheet 230. The ceramic green sheet contains an unfired ceramic material. The ceramic green sheet can be manufactured in the following manner. Ceramic powder that contains a low-temperature-sintered ceramic material, a binder, and a plasticizer are first mixed in predetermined amounts to prepare a ceramic slurry. The ceramic slurry is applied to a carrier film to form a sheet. The slurry can be applied by using a device such as a lip coater or a doctor blade. The thickness of the ceramic green sheet to be manufactured is not limited but is preferably no less than 5 μm and no more than 100 μm.

Electrodes 240 and interelectrode wires 250 are disposed on the electronic component mounting surface 10 of the ceramic green sheet 230. The electrodes 240 and the interelectrode wires 250 become the electrodes 40 and the interelectrode wires 50 of the ceramic substrate 1 illustrated in FIG. 2 by being fired. There are a plurality of electrodes 240, and the interelectrode wires 250 connect the electrodes 240 to each other. The electrodes 240 and the interelectrode wires 250 can be formed on the electronic component mounting surface 10 of the ceramic green sheet 230 by a method such as screen printing, inkjet, rotogravure, or photolithography. In the case where the ceramic substrate to be manufactured is a multilayer substrate, a multilayer body obtained by pressure bonding ceramic green sheets that include wires and that are stacked is regarded as the single ceramic green sheet, and the following process can be performed. A main surface of the multilayer body on which the electronic components are mounted corresponds to the electronic component mounting surface of the ceramic green sheet.

Subsequently, as illustrated in FIG. 6B, the ceramic green sheet 230 is reversed such that the electrodes 240 and the interelectrode wires 250 face to the resist patterns 260 of the resist sheet 200 to stack the ceramic green sheet 230 and the resist sheet 200 as illustrated in FIG. 6C. At this time, the resist patterns 260 extend across the interelectrode wires 250 and overlaps with the interelectrode wires 250. The ceramic green sheet 230 and the resist sheet 200 that are stacked are pressure-bonded. The pressure, temperature, time of pressure bonding can be preset.

Figure 7A:
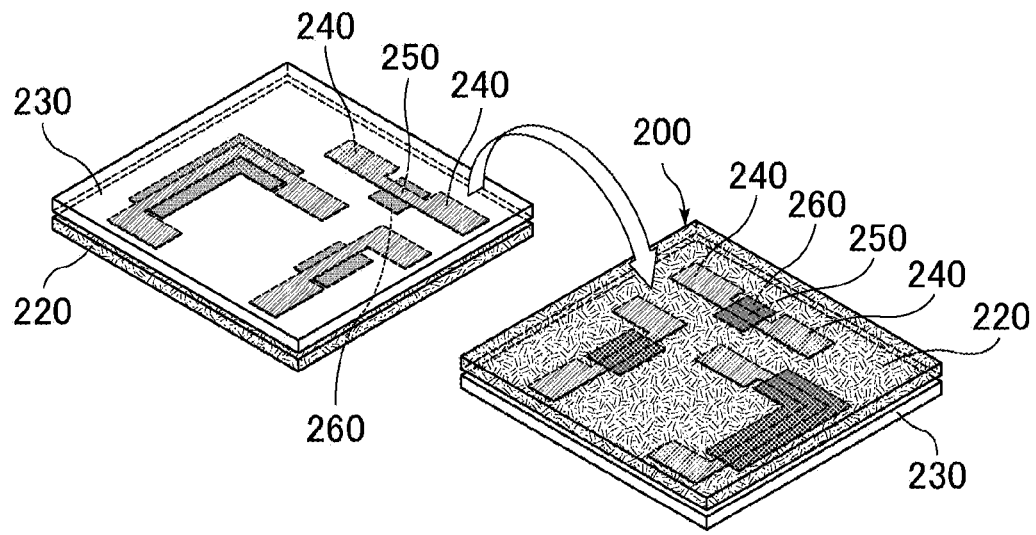
FIG. 7A and FIG. 7B schematically illustrate the process diagrams of a part of the first aspect of the method for manufacturing the ceramic substrate.
Figure 7B:
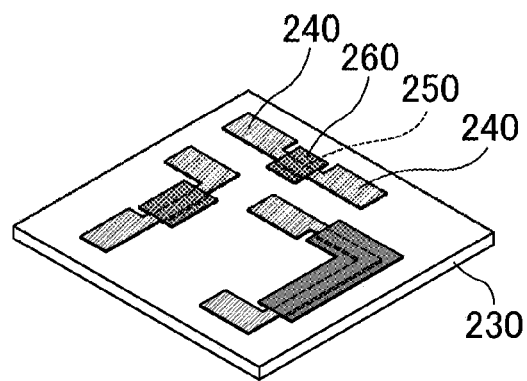

FIG. 7A and FIG. 7B schematically illustrate the process diagrams of a part of the first aspect of the method for manufacturing the ceramic substrate. FIG. 7A illustrates a situation in which the ceramic green sheet 230 and the resist sheet 200 that are pressure-bonded are reversed such that the resist sheet 200 faces upward. When the transfer sheet 220 that forms the resist sheet 200 is separated from the ceramic green sheet 230, the resist patterns 260 remain on the ceramic green sheet 230. Consequently, resists on the transfer sheet are transferred so as to extend across the interelectrode wires.

As illustrated in FIG. 7B, the ceramic green sheet to which the resists are transferred is fired to sinter an unsintered ceramic material that is contained in the ceramic green sheet, and the ceramic layer is formed. The electrodes, the interelectrode wires, and the resists on the ceramic green sheet are also fired. Consequently, the ceramic substrate 1 illustrated in FIG. 2 can be obtained.

A second aspect of the method for manufacturing the ceramic substrate will now be described. According to the second aspect of the method for manufacturing the ceramic substrate, the resist sheet is prepared in a manner in which the resist pattern is applied to a firing sheet that is made of a material that is burnt out at a firing temperature of the ceramic green sheet, the resist sheet that is formed of the firing sheet to which the resist pattern is applied is disposed and pressure-bonded such that the resist pattern overlaps with the electronic component mounting surface of the ceramic green sheet, and the firing sheet is burnt out by firing the ceramic green sheet and the resist sheet to transfer the resist such that the resist on the firing sheet extends across the interelectrode wire. The second aspect of the method for manufacturing the ceramic substrate differs from the first aspect in that the firing sheet is used as the resist sheet, and a sheet portion of the resist sheet is removed by firing. FIG. 8A, FIG. 8B, FIG. 8C, and FIG. 8D schematically illustrate the process diagrams of the second aspect of the method for manufacturing the ceramic substrate.

Figure 8A:
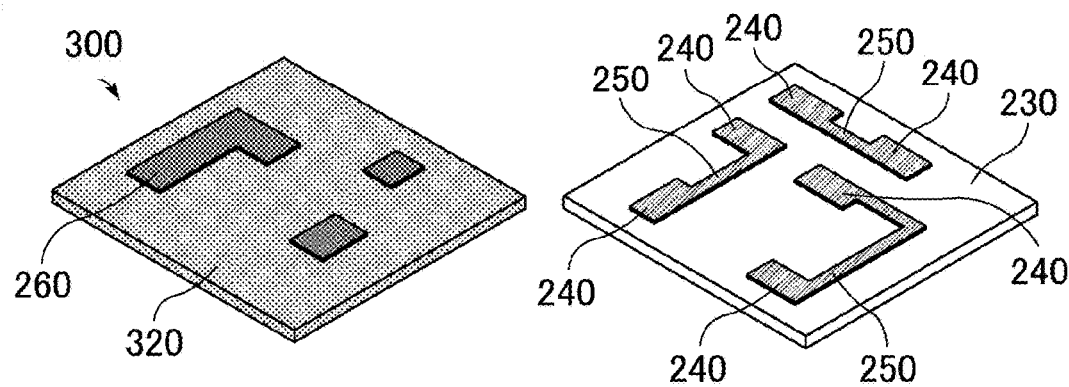
FIG. 8A, FIG. 8B, FIG. 8C, and FIG. 8D schematically illustrate the process diagrams of a second aspect of the method for manufacturing the ceramic substrate.

As illustrated in FIG. 8A, the resist patterns 260 are first applied to a firing sheet 320. The resist patterns can be applied to the firing sheet by the same method as the method of applying the resist patterns to the release film according to the first aspect. The firing sheet is made of a material that is burnt out at the firing temperature of the ceramic green sheet. The firing temperature of the ceramic green sheet differs depending on the composition of the ceramic material that is contained in the ceramic green sheet and is typically no less than 200° C. and no more than 1000° C. Whether the firing sheet is burnt out at the firing temperature is determined by a rate of decrease in weight when the firing sheet is left for 2 hours in a furnace the temperature of which is set to the firing temperature. When the rate of decrease in weight is 5% or more, it is determined that the firing sheet is burnt out at the firing temperature.

Specific examples of the firing sheet preferably include a resin sheet and a carbon sheet. Examples of the resin sheet can include an acrylic resin sheet and a polystyrene resin sheet. The thickness of the firing sheet is preferably 5 μm or more and is preferably 100 μm or less.

The firing sheet 320 to which the resist patterns 260 are applied becomes a resist sheet 300. The ceramic green sheet 230 that is the same as described according to the first aspect is separately prepared (see the right-hand side in FIG. 8A).

Figure 8B:
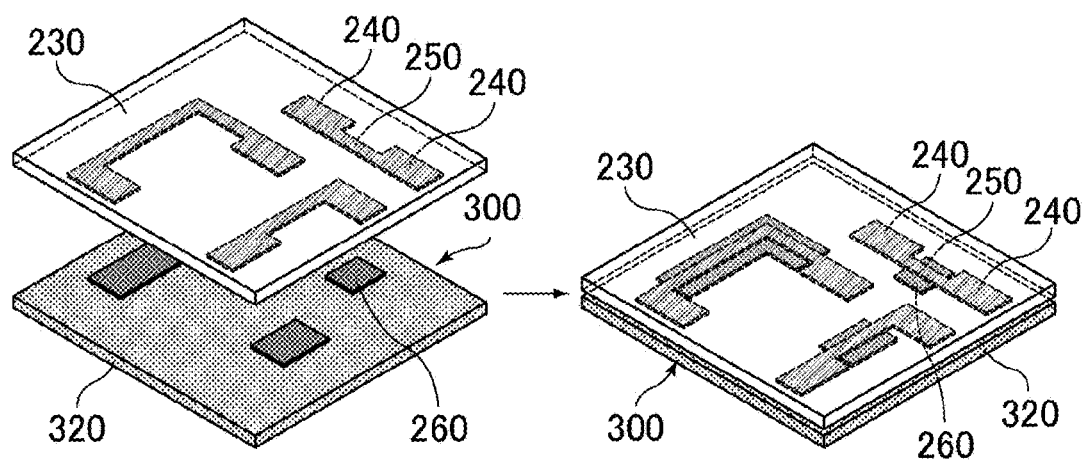

Subsequently, as illustrated on the left-hand side in FIG. 8B, the ceramic green sheet 230 is reversed such that the electrodes 240 and the interelectrode wires 250 face to the resist patterns 260 of the resist sheet 300 to stack the ceramic green sheet 230 and the resist sheet 300 as illustrated on the right-hand side in FIG. 8B. At this time, the resist patterns 260 extend across the interelectrode wires 250 and overlap with the interelectrode wires 250. The ceramic green sheet 230 and the resist sheet 300 that are stacked are pressure-bonded. The pressure, temperature, time of pressure bonding can be preset.

Figure 8C:
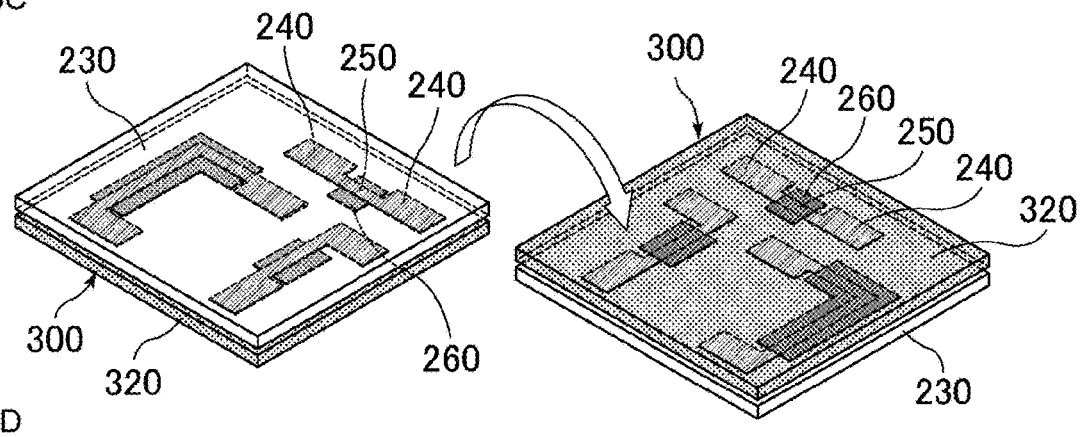
Figure 8D:
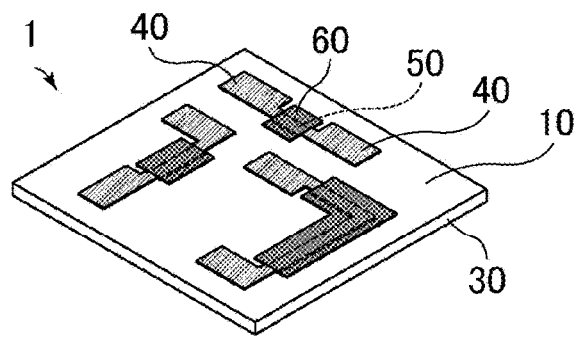

FIG. 8C illustrates a situation in which the ceramic green sheet 230 and the resist sheet 300 that are pressure-bonded are reversed such that the resist sheet 300 faces upward. The ceramic green sheet 230 and the resist sheet 300 are fired at the firing temperature of the ceramic green sheet. An unsintered ceramic material that is contained in the ceramic green sheet is sintered by firing, and the ceramic layer is formed. The electrodes and the interelectrode wires on the ceramic green sheet are also fired. At the same time, the firing sheet 320 of which the resist sheet 300 is formed is burnt out by firing. The resist patterns 260 are not burnt out but are fired and remain. Accordingly, the resists on the firing sheet are transferred so as to extend across the interelectrode wires. Consequently, the ceramic substrate 1 illustrated in FIG. 8D can be obtained. The ceramic substrate 1 is the same as the ceramic substrate 1 illustrated in FIG. 2.

A third aspect of the method for manufacturing the ceramic substrate will now be described. According to the third aspect of the method for manufacturing the ceramic substrate, the resist sheet is prepared in a manner in which the resist pattern is applied to a separation sheet that is capable of being separated after the separation sheet is pressure-bonded to the ceramic green sheet, the resist sheet that is formed of the separation sheet to which the resist pattern is applied is disposed and pressure-bonded such that the resist pattern overlaps with the electronic component mounting surface of the ceramic green sheet, and the separation sheet is separated to transfer the resist such that the resist on the separation sheet extends across the interelectrode wire. According to the third aspect of the method for manufacturing the ceramic substrate, the separation sheet is used as the resist sheet. The third aspect differs from the first aspect in that the release film is not used, and the resist pattern is directly applied to the separation sheet to prepare the resist sheet. FIG. 9A, FIG. 9B, FIG. 9C, and FIG. 9D schematically illustrate the process diagrams of the third aspect of the method for manufacturing the ceramic substrate.

Figure 9A:
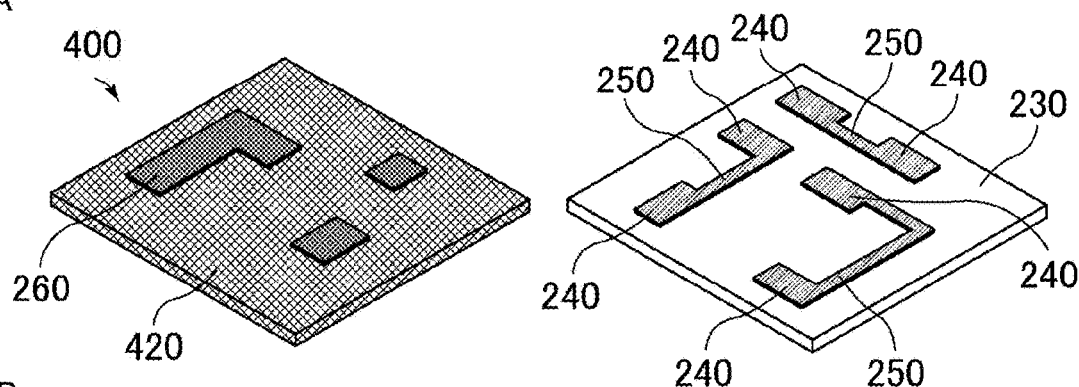
FIG. 9A, FIG. 9B, FIG. 9C, and FIG. 9D schematically illustrate the process diagrams of a third aspect of the method for manufacturing the ceramic substrate.

As illustrated in FIG. 9A, the resist patterns 260 are applied to a separation sheet 420. The resist patterns can be applied to the separation sheet by the same method as the method of applying the resist patterns to the release film according to the first aspect. The separation sheet is capable of being separated after the separation sheet is pressure-bonded to the ceramic green sheet. A release agent such as a silicone release agent or a fluorine release agent may be applied to the upper surface to make it easy to separate the sheet.

Specific examples of the separation sheet preferably include a resin sheet and a carbon sheet. Examples of the resin sheet can include an acrylic resin sheet and a polystyrene resin sheet. The thickness of the separation sheet is preferably 5 μm or more and is preferably 100 μm or less.

The separation sheet 420 to which the resist patterns 260 are applied becomes a resist sheet 400. The ceramic green sheet 230 that is the same as described according to the first aspect is separately prepared (see the right-hand side in FIG. 9A).

Figure 9B:
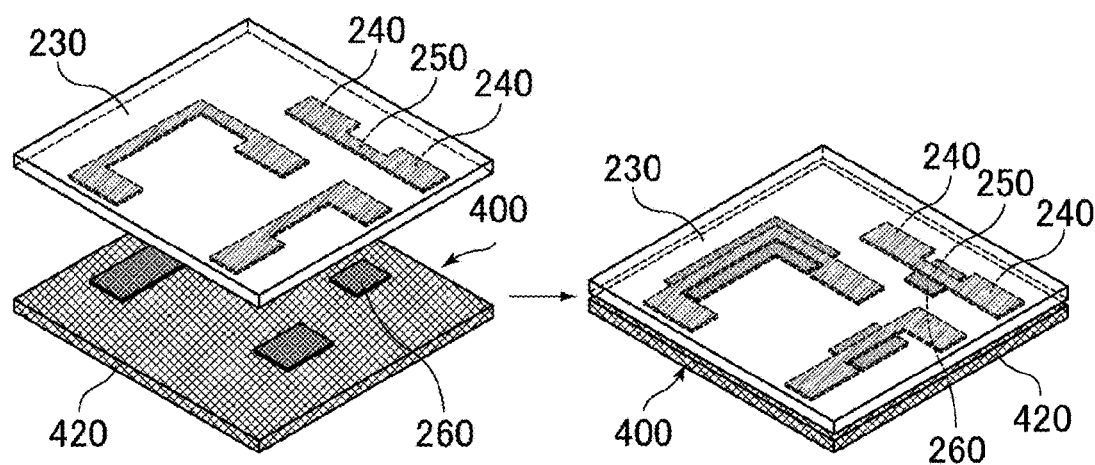

Subsequently, as illustrated on the left-hand side in FIG. 9B, the ceramic green sheet 230 is reversed such that the electrodes 240 and the interelectrode wires 250 face to the resist patterns 260 of the resist sheet 400 to stack the ceramic green sheet 230 and the resist sheet 400 as illustrated on the right-hand side in FIG. 9B. At this time, the resist patterns 260 extend across the interelectrode wires 250 and overlaps with the interelectrode wires 250. The ceramic green sheet 230 and the resist sheet 400 that are stacked are pressure-bonded. The pressure, temperature, time of pressure bonding can be preset.

Figure 9C:
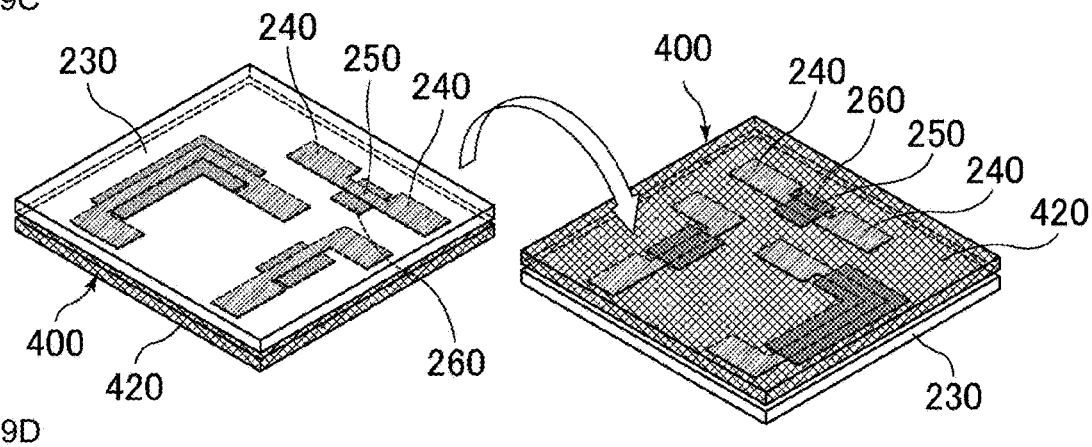

FIG. 9C illustrates a situation in which the ceramic green sheet 230 and the resist sheet 400 that are pressure-bonded are reversed such that the resist sheet 400 faces upward. When the separation sheet 420 of which the resist sheet 400 is formed is separated from the ceramic green sheet 230, the resist patterns 260 remain on the ceramic green sheet 230. Consequently, the resists on the separation sheet are transferred so as to extend across the interelectrode wires.

Figure 9D:
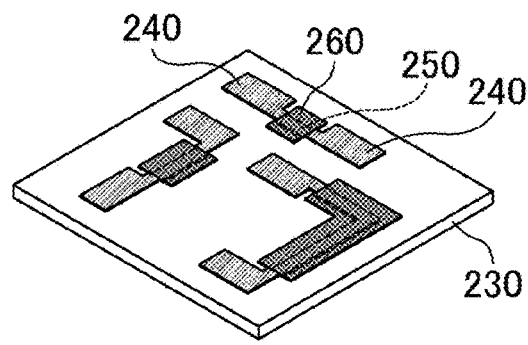

As illustrated in FIG. 9D, the ceramic green sheet to which the resists are transferred is fired to sinter an unsintered ceramic material that is contained in the ceramic green sheet, and the ceramic layer is formed. The electrodes, the interelectrode wires, and the resists on the ceramic green sheet are also fired. Consequently, the ceramic substrate 1 illustrated in FIG. 2 can be obtained.

The above aspects of the method according to the present disclosure for manufacturing the ceramic substrate enable the ceramic substrate according to the present disclosure to be manufactured. In the aspects of the method according to the present disclosure for manufacturing the ceramic substrate, the resist sheet is disposed and pressure-bonded such that the resist patterns of the resist sheet extend across the interelectrode wires and overlap with the electronic component mounting surface of the ceramic green sheet. Each interelectrode wire is pushed into the ceramic green sheet by pressure bonding, and a portion of the interelectrode wire is embedded in the ceramic green sheet. Consequently, as illustrated in FIG. 3, the upper surface of the resist 60a, and the upper surface of the portion of the interelectrode wire 50a, the electrode 40a, and the electrode 40b in the vicinity of the resist 60a are flush with each other. That is, the method according to the present disclosure for manufacturing the ceramic substrate enables the ceramic substrate to have high coplanarity of the vicinity of the interelectrode wires.

Another aspect of the ceramic substrate according to the present disclosure is characterized in that the ceramic substrate includes an electrode on the electronic component mounting surface, and a resist that divides the electrode into a plurality of of electrode pieces by extending across the electrode is disposed on the electronic component mounting surface. This aspect differs from the aspect of the ceramic substrate according to the present disclosure described above in that the resist does not extend across the interelectrode wire but extends across the electrode. A preferable aspect of the other structure is the same as described above.

Figure 10A:
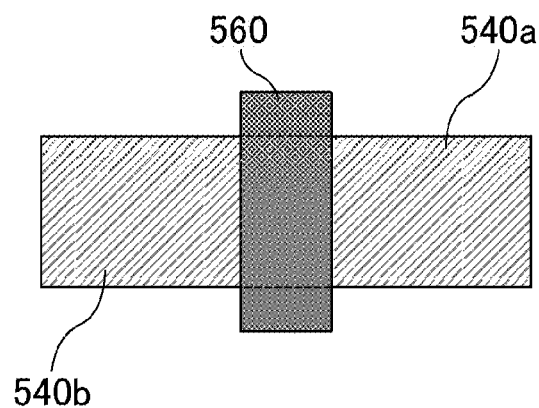
FIG. 10A is a schematic top view of a portion of a ceramic substrate according to an embodiment of the present disclosure in which a resist that extends across an electrode is disposed.

FIG. 10A is a schematic top view of a portion of a ceramic substrate according to an embodiment of the present disclosure in which a resist that extends across an electrode is disposed. FIG. 10A schematically illustrates a situation in which a resist 560 divides the electrode into the electrode pieces, which correspond to an electrode 540a and an electrode 540b, by extending across the electrode. The electrode 540*a* and the electrode 540*b* can be regarded as a single electrode before the resist 560 is disposed thereon. The fact that the electrode 540*a* and the electrode 540*b* are connected to each other is represented by illustrating a portion that is concealed under the resist 560 by the dotted lines.

Figure 10B:
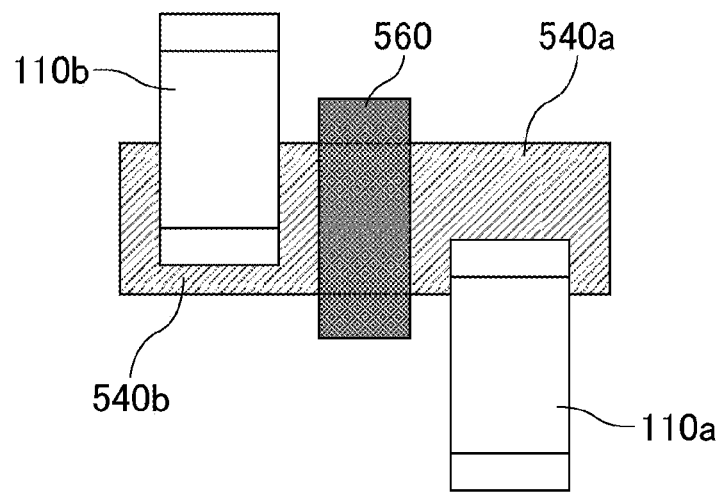
FIG. 10B is a schematic top view of the divided electrode pieces on which corresponding electronic components are mounted.

FIG. 10B is a schematic top view of the divided electrode pieces on which the corresponding electronic components (a multilayer ceramic capacitor 110*a* and a multilayer ceramic capacitor 110*b*) are mounted. In a ceramic substrate according to this aspect of the present disclosure, by disposing the resist that extends across the electrode, it is possible to divide the electrode into the electrode pieces for use even when no interelectrode wire is disposed on the electronic component mounting surface. The electronic components can be mounted on the corresponding electrode pieces of to obtain an electronic device. This aspect also enables solder to be prevented from spreading out between the electrode pieces of when the components are mounted.

Another aspect of the method according to the present disclosure for manufacturing the ceramic substrate is characterized in that the method includes a step of preparing a ceramic green sheet including an electrode on the electronic component mounting surface, a step of preparing a resist sheet that has a resist pattern on an upper surface, and a step of disposing and pressure-bonding the resist sheet such that the resist pattern overlaps with the electronic component mounting surface of the ceramic green sheet, and transferring a resist such that the resist of the resist sheet extends across the electrode. The method according to this aspect of the present disclosure for manufacturing the ceramic substrate enables the resist to be transferred such that the resist of the resist sheet extends across the electrode. The ceramic substrate that includes the divided electrode pieces can be manufactured. A specific aspect of the step of transferring the resist such that the resist of the resist sheet extends across the electrode can be the same as the above-described step of transferring each resist such that the resist of the resist sheet extends across the corresponding interelectrode wire, and a detailed description thereof is omitted.

EXAMPLES

Examples will be described below to disclose the ceramic substrate according to the present disclosure and the method according to the present disclosure for manufacturing the ceramic substrate more specifically. The present disclosure is not limited to only the examples.

Example 1

A ceramic green sheet including a plurality of electrodes and interelectrode wires connecting the electrodes to each other was prepared by applying a conductive paste containing Cu to the ceramic green sheet by screen printing. Separately, a resist paste containing the same ceramic material as the ceramic material of which the ceramic green sheet was made was applied to a PET release film to form resist patterns. A transfer sheet formed of a PET resin sheet and the release film were stacked and pressure-bonded, and the resist patterns were transferred to the transfer sheet. Subsequently, the ceramic green sheet and the transfer sheet were stacked such that the resist patterns extended across the interelectrode wires and pressure-bonded. The transfer sheet was separated to transfer the resists such that the resists on the transfer sheet extended across the interelectrode wires. Subsequently, the ceramic material of which the ceramic green sheet was made was fired at the firing temperature to obtain a ceramic substrate.

Comparative Example 1

A ceramic green sheet was prepared in the same manner as in Example 1. A resist paste containing the same ceramic material as the ceramic material of which the ceramic green sheet was made was directly applied by screen printing so as to extend across interelectrode wires on the ceramic green sheet. Subsequently, the ceramic material of which the ceramic green sheet was made was fired at the firing temperature without performing the pressure bonding to obtain a ceramic substrate.

(Evaluation of Coplanarity)

The coplanarity of the ceramic substrates obtained in Example 1 and Comparative Example 1 was obtained in a manner in which the size of a step in a region (the region in the enlarged sectional view in FIG. 3) in the vicinity of the interelectrode wire was measured by observing a section in the region with an electron microscope. In the ceramic substrate manufactured in Example 1, a portion of each interelectrode wire was embedded in the ceramic layer, and the coplanarity in the vicinity of the interelectrode wire was 5 In the ceramic substrate manufactured in Comparative Example 1, the height of each interelectrode wire was equal to the height of the corresponding electrode, and each resist was formed on the corresponding interelectrode wire. Accordingly, the height of each resist was more than the height of the corresponding electrode and the height of the corresponding interelectrode wire by the thickness of the resist. Consequently, the coplanarity in the vicinity of each interelectrode wire was poor. The coplanarity was 30 µm.

Thus, it can be said that the measured value of the coplanarity in the vicinity of each interelectrode wire of the ceramic substrate in Example 1 is small (high coplanarity), and the work efficiency when the electronic components are mounted can be increased.

1 ceramic substrate
10 electronic component mounting surface
20 motherboard mounting surface
30 ceramic layer
40, 40*a*, 40*b*, 40*c*, 40*d*, 40*e*, 40*f*, 540*a*, 540*b* electrode (electrode mounted on the electronic component mounting surface)
45 motherboard electrode
50, 50*a*, 50*a'*, 50*b*, 50*c* interelectrode wire
51' front surface of the interelectrode wire
52' back surface of the interelectrode wire
60, 60*a*, 60*b*, 60*c*, 560 resist
100 electronic device
110, 110*a*, 110*b* electronic component (multilayer ceramic capacitor)
120 electronic component (semiconductor component)
200, 300, 400 resist sheet
210 release film
220 transfer sheet
230 ceramic green sheet
240 electrode (unfired electrode)
250 interelectrode wire (unfired interelectrode wire)
260 resist pattern
320 firing sheet
420 separation sheet

The invention claimed is:

1. A ceramic substrate comprising:
a plurality of electrodes on an electronic component mounting surface; and
one or more interelectrode wires each connecting the electrodes to each other on the electronic component mounting surface,
wherein a resist extending across an interelectrode wire is disposed on the electronic component mounting surface, wherein the interelectrode wire is bent downward to be laid deeper than two electrodes that are connected by the interelectrode wire, and
wherein the resist is embedded in the interelectrode wire where the resist is extending across the interelectrode wire.

2. The ceramic substrate according to claim 1, wherein an upper surface of the resist extending across the interelectrode wires is flat.

3. The ceramic substrate according to claim 2, wherein each of the electrodes and the interelectrode wires includes a front surface, a back surface, a front surface corner portion extending from the front surface toward the back surface and having a round chamfer shape, and a back surface corner portion extending from the back surface toward the front surface and having a round chamfer shape, and wherein a radius of curvature of the back surface corner portion is larger than a radius of curvature of the front surface corner portion.

4. The ceramic substrate according to claim 1, wherein each of the electrodes and the interelectrode wires includes a front surface, a back surface, a front surface corner portion extending from the front surface toward the back surface and having a round chamfer shape, and a back surface corner portion extending from the back surface toward the front surface and having a round chamfer shape, and wherein a radius of curvature of the back surface corner portion is larger than a radius of curvature of the front surface corner portion.

* * * * *

UNITED STATES PATENT AND TRADEMARK OFFICE
CERTIFICATE OF CORRECTION

PATENT NO. : 10,999,927 B2  
APPLICATION NO. : 16/394459  
DATED : May 4, 2021  
INVENTOR(S) : Yosuke Mino Page 1 of 1

It is certified that error appears in the above-identified patent and that said Letters Patent is hereby corrected as shown below:

In the Specification

Column 14, Line 51, "51' front surface of the interelectrode wire" should read -- 51 51' front surface of the interelectrode wire --.

Column 14, Line 52, "52' back surface of the interelectrode wire" should read -- 52 52' back surface of the interelectrode wire --.

Signed and Sealed this  
Twelfth Day of April, 2022

Drew Hirshfeld  
*Performing the Functions and Duties of the*  
*Under Secretary of Commerce for Intellectual Property and*  
*Director of the United States Patent and Trademark Office*